United States Patent
Shioda et al.

(10) Patent No.: US 10,243,602 B2
(45) Date of Patent: Mar. 26, 2019

(54) WIRELESS RECEIVER

(71) Applicant: KABUSHIKI KAISHA TOSHIBA, Tokyo (JP)

(72) Inventors: Tomoki Shioda, Kanagawa (JP); Hiroshi Yoshida, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/688,575

(22) Filed: Aug. 28, 2017

(65) Prior Publication Data
US 2018/0262223 A1    Sep. 13, 2018

(30) Foreign Application Priority Data
Mar. 7, 2017    (JP) .................. 2017-043208

(51) Int. Cl.
*H04L 27/08*    (2006.01)
*H04B 1/16*    (2006.01)
*H03G 3/30*    (2006.01)

(52) U.S. Cl.
CPC ............ *H04B 1/16* (2013.01); *H03G 3/3068* (2013.01)

(58) Field of Classification Search
CPC ... H04L 27/3809; H04L 27/08; H04B 1/0007; H04B 1/0028
USPC ....................................................... 375/345
See application file for complete search history.

(56) References Cited

U.S. PATENT DOCUMENTS

| | | | |
|---|---|---|---|
| 5,758,271 A * | 5/1998 | Rich | H04W 52/18 455/226.2 |
| 9,118,294 B2 | 8/2015 | Mochizuki | |
| 9,190,972 B2 | 11/2015 | Li et al. | |
| 2007/0287400 A1* | 12/2007 | Yu | H03G 3/3068 455/232.1 |
| 2009/0088101 A1* | 4/2009 | Agawa | H04B 1/38 455/127.2 |
| 2009/0088112 A1 | 4/2009 | Nonin | |
| 2013/0202068 A1* | 8/2013 | Ly-Gagnon | H04W 52/0225 375/343 |
| 2013/0279556 A1* | 10/2013 | Seller | H03G 3/3068 375/227 |
| 2016/0126970 A1* | 5/2016 | Xu | H03M 1/1023 341/118 |

FOREIGN PATENT DOCUMENTS

| | | |
|---|---|---|
| JP | 200988972 A | 4/2009 |
| JP | 2013157985 A | 8/2013 |
| JP | 5783251 B2 | 9/2015 |

* cited by examiner

*Primary Examiner* — Kevin Kim
(74) *Attorney, Agent, or Firm* — Kim & Stewart LLP

(57) ABSTRACT

A wireless receiver includes an analog-to-digital converter that converts a signal corresponding to a received signal into a digital signal on the basis of multiple reference voltages and outputs the digital signal. The wireless receiver also includes a control circuit that controls at least one of the multiple reference voltages on the basis of the digital signal that is output from the analog-to-digital converter.

17 Claims, 6 Drawing Sheets

WIRELESS RECEIVER

CROSS-REFERENCE TO RELATED APPLICATION

This application is based upon and claims the benefit of priority from Japanese Patent Application No. 2017-043208, filed Mar. 7, 2017, the entire contents of which are incorporated herein by reference.

FIELD

Embodiments described herein relate generally to a wireless receiver.

BACKGROUND

An analog baseband section of a wireless receiver usually requires an automatic gain control (AGC) circuit to automatically adjust an amplitude of an intermediate frequency (IF) signal that is obtained from a received signal. This is because the strength of the received signal varies in accordance with the parameters of the wireless transmitter, the parameters of the wireless receiver, surrounding environment, and other factors. The AGC circuit is constituted of, for example, a variable gain amplifier (VGA) circuit and a programmable gain amplifier (PGA) circuit. However, in this case, the size of the AGC circuit tends to be relatively large. This problem can occur in a superheterodyne wireless receiver as well as in a direct-conversion wireless receiver.

DETAILED DESCRIPTION

In general, according to one embodiment, a wireless receiver includes an analog-to-digital converter configured to convert a first signal corresponding to a received signal into a digital signal on the basis of multiple reference voltages and output the digital signal. A control circuit is configured to control at least one of the multiple reference voltages on the basis of the digital signal that is output from the analog-to-digital converter.

Hereinafter, example embodiments of the present disclosure will be described with reference to the drawings.

First Embodiment

Figure 1:
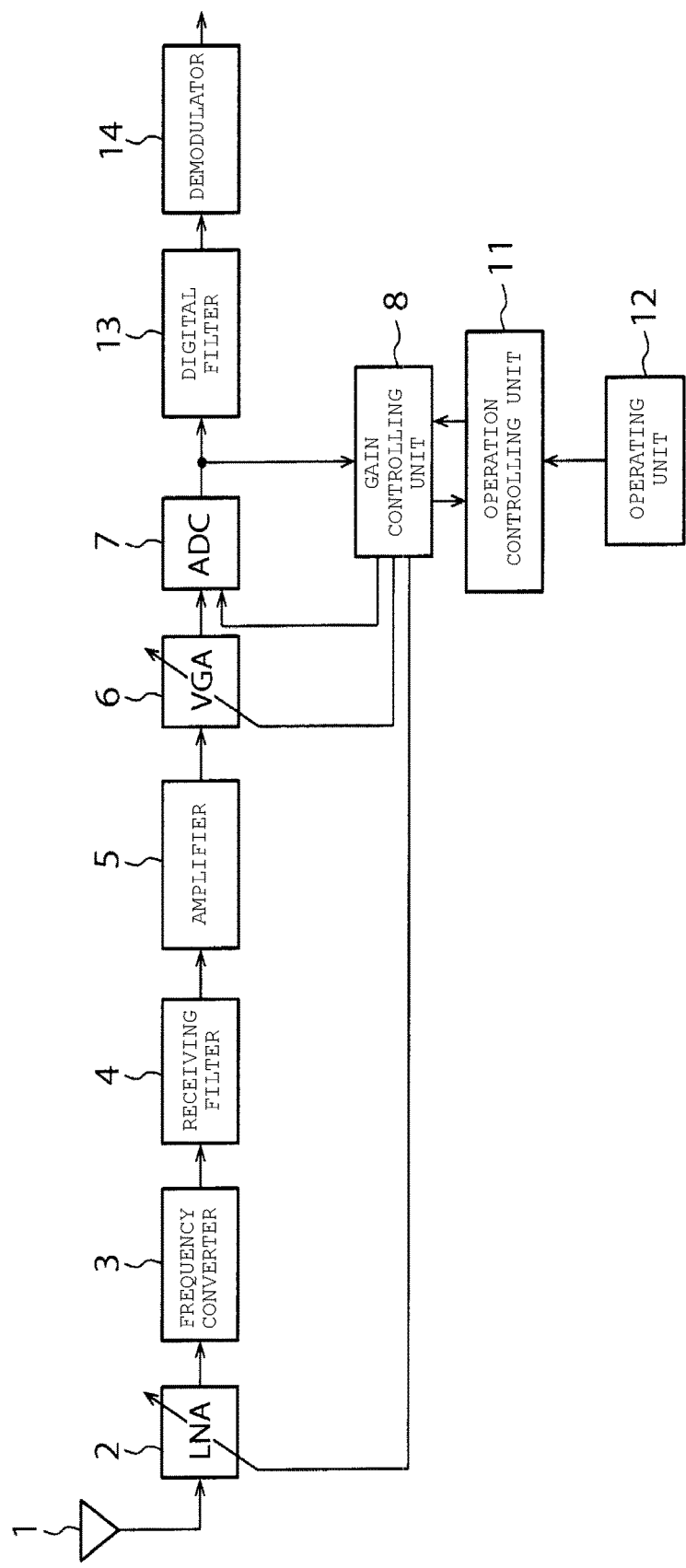
FIG. 1 is a schematic diagram showing a structure of a wireless receiver according to a first embodiment.

FIG. 1 is a schematic diagram showing a structure of a wireless receiver of a first embodiment.

The wireless receiver shown in FIG. 1 includes an antenna 1, a low-noise amplifier (LNA) 2, a frequency converter 3, a receiving filter 4, an amplifier 5, a variable gain amplifier (VGA) 6, an ADC 7, a gain controlling unit 8, which is, for example a gain control circuit, an operation controlling unit 11, which is, for example, an operation control circuit, an operating unit 12, which is, for example, an operating circuit, a digital filter 13, and a demodulator 14.

The antenna 1 receives a radio frequency (RF) signal. This received signal is amplified by the LNA 2, which has a gain that is adjustable, and is then output to the frequency converter 3. The gain of the LNA 2 is incrementally adjusted by the gain controlling unit 8.

The frequency converter 3 has a receiving mixer and a local oscillator and converts the amplified RF signal from the LNA 2 into an IF signal, also known as a frequency-converted signal. The receiving filter 4 filters the IF signal to extract a desired frequency component. After passing through the receiving filter 4, the filtered IF signal, also known as a frequency-filtered signal, is output to the amplifier 5.

The amplifier 5 amplifies the filtered IF signal from the receiving filter 4 and outputs the amplified filtered IF signal to the VGA 6. The VGA 6 has a gain that is adjustable in accordance with an analog controlling signal, and the VGA 6 amplifies the amplified filtered IF signal from the amplifier 5 and outputs the resultant IF signal to the ADC 7. The gain of the VGA 6 is continuously adjusted by the gain controlling unit 8.

The ADC 7 converts the resultant IF signal from the VGA 6 into a digital signal on the basis of multiple reference voltages. The gain controlling unit 8 controls the gains of the LNA 2 and the VGA 6 on the basis of the digital signal output from the ADC 7. The gain controlling unit 8 outputs a gain controlling signal for the LNA 2 and a gain controlling signal for the VGA 6. The gain controlling unit 8 also controls at least one of the reference voltages of the ADC 7 on the basis of the digital signal output from the ADC 7 by using a controlling signal. This controlling signal is output from the gain controlling unit 8 to the ADC 7.

The operation controlling unit 11 controls the operation of the gain controlling unit 8 on the basis of a communication start signal from the operating unit 12 and the gain controlling signal from the gain controlling unit 8. The digital filter 13 filters the digital signal from the ADC 7 and outputs the filtered digital signal to the demodulator 14. The demodulator 14 demodulates the filtered digital signal (IF signal) to a baseband signal and then finally demodulates the baseband signal to a signal containing original digital information.

Figure 2:
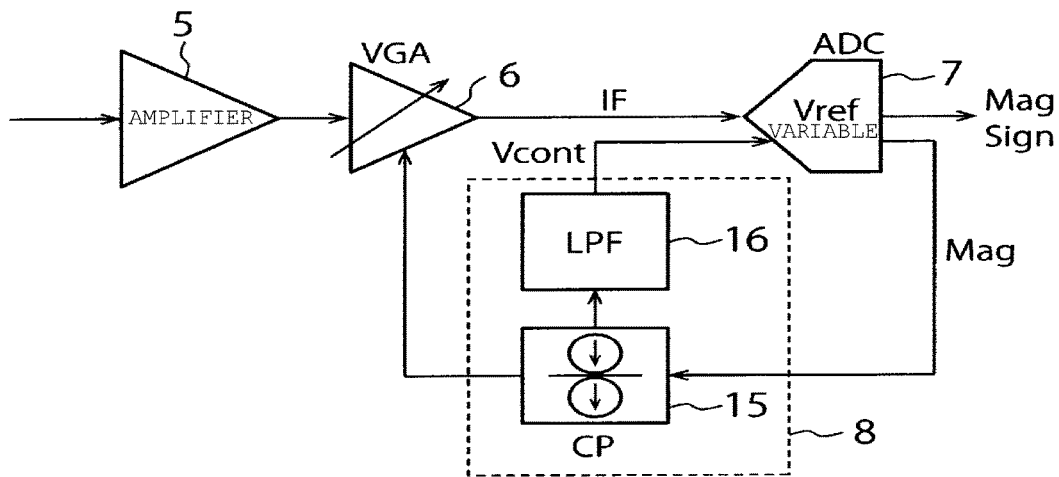
FIG. 2 is a circuit diagram for illustrating a structure of an AGC circuit according to the first embodiment.

FIG. 2 is a circuit diagram for illustrating a structure of an AGC circuit of the first embodiment.

FIG. 2 shows the amplifier 5, the VGA 6, the ADC 7, and the gain controlling unit 8, which are structural components of a part of the wireless receiver of this embodiment. The gain controlling unit 8 has a CP 15 and a low-pass filter (LPF) 16. The AGC circuit of this embodiment is constituted of the VGA 6 and the gain controlling unit 8.

As described above, the VGA 6 amplifies the IF signal from the amplifier 5 and outputs the resultant IF signal. The ADC 7 converts the resultant IF signal from the VGA 6 into the digital signal on the basis of reference voltages Vrefs and outputs the digital signal. The digital signal contains a first signal Mag, which represents an amplitude of the value of the digital signal, and contains a second signal Sign, which represents a sign of the value of the digital signal. The details of these signals are described later.

The CP 15 controls the gain of the VGA 6 on the basis of the digital signal output from the ADC 7. Thus, the amplitude of the IF signal to be input to the ADC 7 is adjusted to be a value that is appropriate for the analog-to-digital conversion. The gain of the VGA 6 of this embodiment is controlled on the basis of the first signal Mag, as shown in FIG. 2.

The CP 15 also controls at least one of the reference voltages Vrefs of the ADC 7 on the basis of the digital signal output from the ADC 7. Specifically, the CP 15 outputs a control signal for controlling at least one of the reference voltages Vrefs, and the control signal is supplied to the ADC 7 through the LPF 16. The LPF 16 is constituted of a capacitor and a resistor, and the LPF 16 filters the control signal and thereby removes high frequency components from the control signal. The reference symbol "Vcont" represents a control signal that is supplied to the ADC 7. The CP 15 of this embodiment operates by using the first signal Mag, as shown in FIG. 2.

Figure 3:
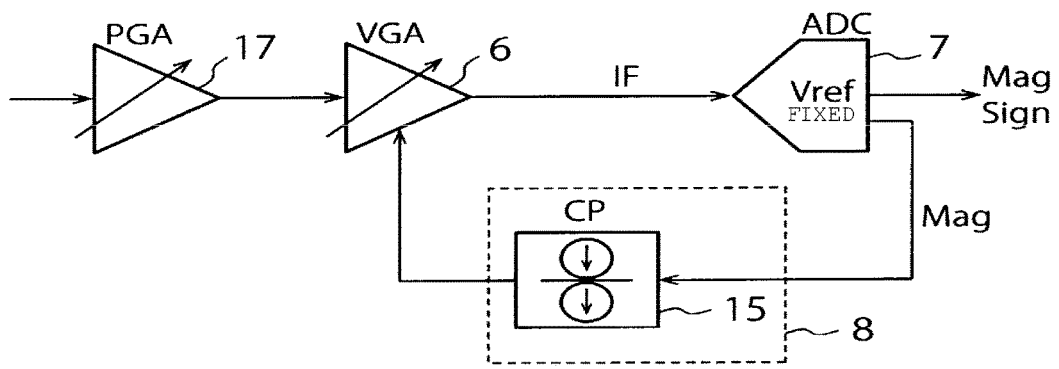
FIG. 3 is a circuit diagram for illustrating a structure of an AGC circuit according to a comparative example.

FIG. 3 is a circuit diagram for illustrating a structure of an AGC circuit of a comparative example.

The AGC circuit of the comparative example is constituted by a PGA 17, a VGA 6, and a gain controlling unit 8. The PGA 17 has a gain that is adjustable in accordance with a digital control signal, and the PGA 17 amplifies the IF signal from the amplifier 5 and outputs the resultant IF signal to the VGA 6.

The AGC circuit of the comparative example roughly adjusts the amplitude of the IF signal by adjusting the gain of the PGA 17 and finely adjusts the amplitude of the IF signal by adjusting the gain of the VGA 6. Thus, the amplitude of the IF signal to be input to the ADC 7 is adjusted to be a value that is appropriate for the analog-to-digital conversion. However, in this case, the size of the AGC circuit is relatively large.

On the other hand, the AGC circuit of the first embodiment does not include the PGA 17 because the reference voltage Vref of the ADC 7 is controlled by the CP 15. That is, in this first embodiment, the function for adjusting the IF signal, which would otherwise be performed by the PGA 17, is replaced by the function of controlling the reference voltage Vref. Accordingly, this first embodiment enables a reduction in size of the AGC circuit as well as reduction in chip area of the wireless receiver, also decreasing the amount of current consumption of the wireless receiver.

The details of the control of the reference voltages Vrefs of the ADC 7 will be described with reference to FIGS. 4 to 7.

Figure 4:
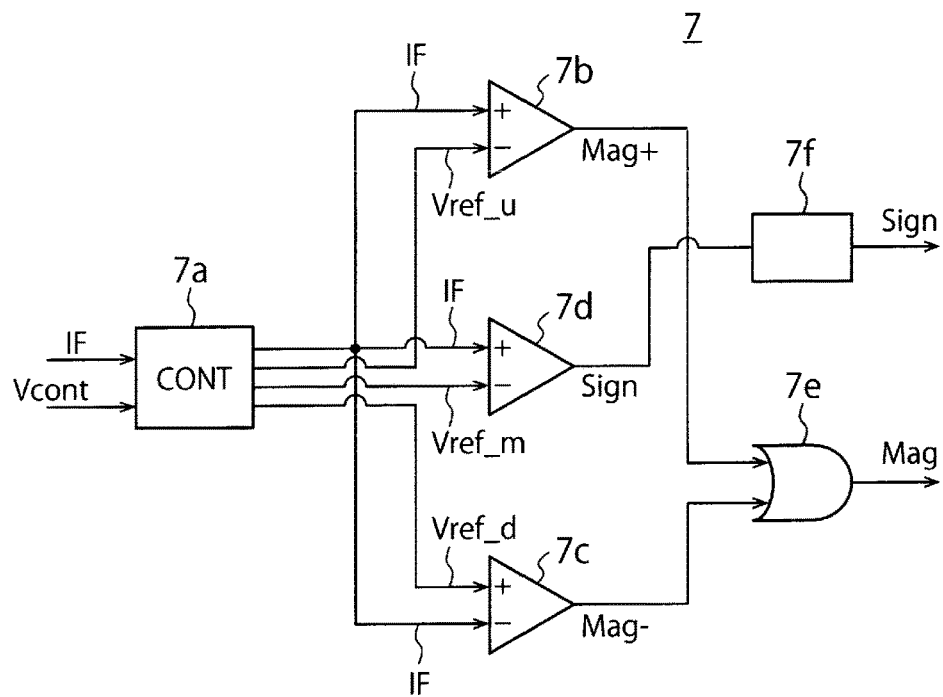
FIG. 4 is a circuit diagram for illustrating a structure of an analog-to-digital converter (ADC) according to the first embodiment.

FIG. 4 is a circuit diagram for illustrating a structure of the ADC 7 of the first embodiment.

The ADC 7 has a control block 7a, a first comparator 7b, a second comparator 7c, a third comparator 7d, a first output part 7e, and a second output part 7f.

The control block 7a outputs the IF signal, which is received from the VGA 6, to a plus input terminal of the first comparator 7b, a minus input terminal of the second comparator 7c, and a plus input terminal of the third comparator 7d. The control block 7a generates a first reference voltage Vref_u, a second reference voltage Vref_d, and a third reference voltage Vref_m as the reference voltages Vrefs described above. The first reference voltage Vref_u is output to a minus input terminal of the first comparator 7b, the second reference voltage Vref_d is output to a plus input terminal of the second comparator 7c, and the third reference voltage Vref_m is output to a minus input terminal of the third comparator 7d. These reference voltages have the following relationship; the first reference voltage Vref_u is greater than the third reference voltage Vref_m, and the third reference voltage Vref_m is greater than the second reference voltage Vref_d.

The reference symbol "Vcont" represents the control signal described above. The control block 7a receives the control signal Vcont from the CP 15 and controls the first reference voltage Vref_u and the second reference voltage Vref_d on the basis of the control signal Vcont. For this structure, the value of the first reference voltage Vref_u and the value of the second reference voltage Vref_d fluctuate with time. On the other hand, the value of the third reference voltage Vref_m is made constant.

The first comparator 7b compares the IF signal and the first reference voltage Vref_u and outputs a signal Mag+ as the comparison result. The signal Mag+ represents an amplitude of the IF signal when the voltage of the IF signal is higher than the third reference voltage Vref_m.

The second comparator 7c compares the IF signal and the second reference voltage Vref_d and outputs a signal Mag− as the comparison result. The signal Mag− represents an amplitude of the IF signal when the voltage of the IF signal is lower than the third reference voltage Vref_m.

The third comparator 7d compares the IF signal and the third reference voltage Vref_m and outputs a signal Sign as the comparison result. The signal Sign represents a sign of the IF signal, that is, the state that the voltage of the IF signal is higher (+) or lower (−) than the third reference voltage Vref_m.

Each of the first output part 7e and the second output part 7f is a circuit for outputting the following digital signal. Specifically, the first output part 7e outputs a first signal Mag, which is a result of combining the signal Mag+ from the first comparator 7b and the signal Mag− from the second comparator 7c in OR operation. The first signal Mag represents an amplitude of the value of the digital signal. The second output part 7f outputs the signal Sign from the third comparator 7d as a second signal Sign. The second signal Sign represents a sign of the value of the digital signal.

The ADC 7 outputs the first signal Mag and the second signal Sign to the digital filter 13 and other component. Nevertheless, the CP 15 of this embodiment generates the control signal Vcont by only using the first signal Mag among these signals. Hereinafter, the details of the CP 15 will be described with reference to FIG. 5.

Figure 5:
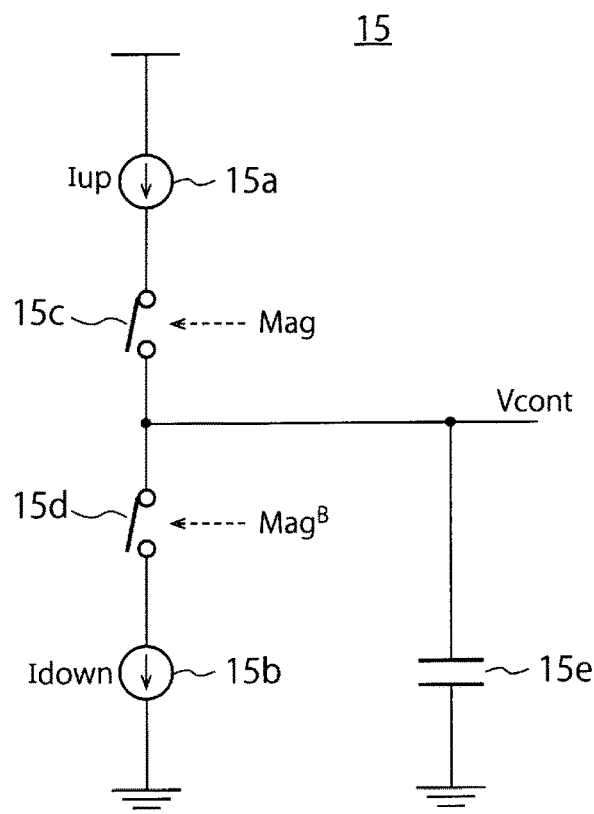
FIG. 5 is a circuit diagram for illustrating a structure of a charge pump (CP) according to the first embodiment.

FIG. 5 is a circuit diagram for illustrating the structure of the CP 15 according to the first embodiment.

The CP 15 has a first current source 15a, a second current source 15b, a first switch 15c, a second switch 15d, and a capacitor 15e.

The first current source 15a supplies a first constant current, and the second current source 15b supplies a second constant current. Each of a duty ratio of the first signal Mag and a duty ratio of the second signal Sign converges to a specific value on the basis of the ratio of the first constant current and the second constant current. The ratio of the first constant current and the second constant current of this example is, for example 1:2.

The first switch 15c and the second switch 15d are connected in series between the first current source 15a and the second current source 15b. The first switch 15c operates in accordance with the first signal Mag, and specifically, the first switch 15c is closed when the first signal Mag is high. On the other hand, the second switch 15d operates in accordance with an inverted signal $Mag^B$ of the first signal Mag, and specifically, the second switch 15d is closed when the first signal Mag is low.

The capacitor 15e is arranged between a ground node and a node between the first switch 15c and the second switch 15d. The CP 15 outputs the control signal Vcont through the node between the first switch 15c and the second switch 15d.

For example, the duty ratio of the first signal Mag is increased as the difference between the first reference voltage Vref_u and the third reference voltage Vref_m is smaller compared with the amplitude of the IF signal. As a result, the value of the control signal Vcont is decreased, and the difference between the first reference voltage Vref_u and the third reference voltage Vref_m approaches the value of the amplitude of the IF signal.

Conversely, the duty ratio of the first signal Mag is decreased as the difference between the first reference voltage Vref_u and the third reference voltage Vref_m is greater compared with the amplitude of the IF signal. As a result, the value of the control signal Vcont is increased, and the difference between the first reference voltage Vref_u and the third reference voltage Vref_m approaches the value of the amplitude of the IF signal.

Figure 6A:
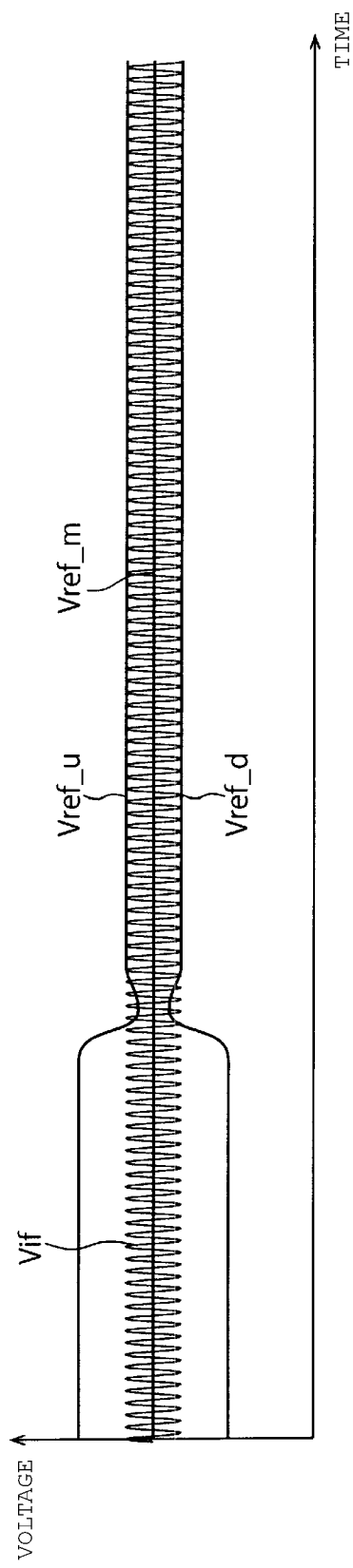
FIGS. 6A and 6B are waveform diagrams for illustrating operation of the wireless receiver according to the first embodiment.
Figure 6B:
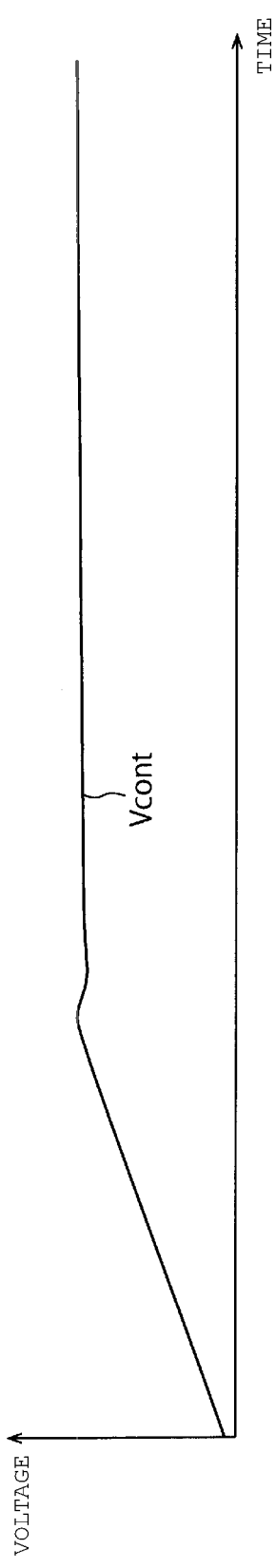

FIGS. 6A and 6B are waveform diagrams for illustrating the operation of the wireless receiver of the first embodiment and show simulation results.

FIG. 6A shows examples of an IF signal Vif that is input to the ADC 7, the first reference voltage Vref_u, the second reference voltage Vref_d, and the third reference voltage Vref_m. FIG. 6B shows fluctuations of the control signal Vcont in the case shown in FIG. 6A.

In the case shown in FIG. 6A, first, the difference between the first reference voltage Vref_u and the third reference voltage Vref_m, and the difference between the third reference voltage Vref_m and the second reference voltage Vref_d, are greater than the amplitude of the IF signal. In this situation, the duty ratio of the first signal Mag is decreased, and the value of the control signal Vcont is increased as shown in FIG. 6B. As a result, the difference between the first reference voltage Vref_u and the third reference voltage Vref_m, and the difference between the third reference voltage Vref_m and the second reference voltage Vref_d, approach the value of the amplitude of the IF signal. Thus, the first reference voltage Vref_u and the second reference voltage Vref_d fluctuate following the IF signal Vif.

As the difference between the first reference voltage Vref_u and the third reference voltage Vref_m becomes smaller as compared with the amplitude of the IF signal, the duty ratio of the first signal Mag is increased. Conversely, as the difference between the first reference voltage Vref_u and the third reference voltage Vref_m becomes greater as compared with the amplitude of the IF signal, the duty ratio of the first signal Mag is decreased. The same applies to the difference between the third reference voltage Vref_m and the second reference voltage Vref_d. When the first reference voltage Vref_u and the second reference voltage Vref_d fluctuate following the IF signal Vif, the duty ratio of the first signal Mag is maintained at a constant value.

Figure 7A:
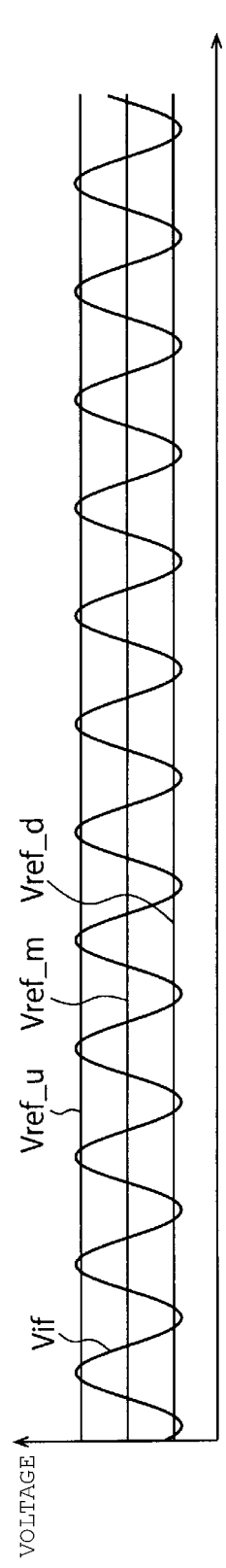
FIGS. 7A to 7C are other waveform diagrams for illustrating the operation of the wireless receiver according to the first embodiment.
Figure 7B:
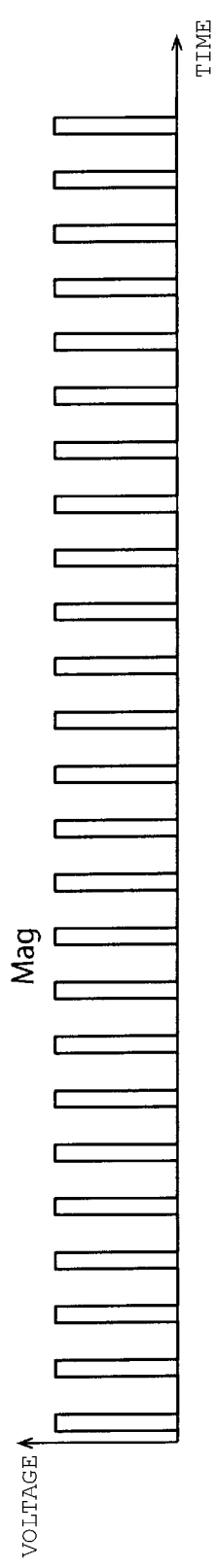
Figure 7C:
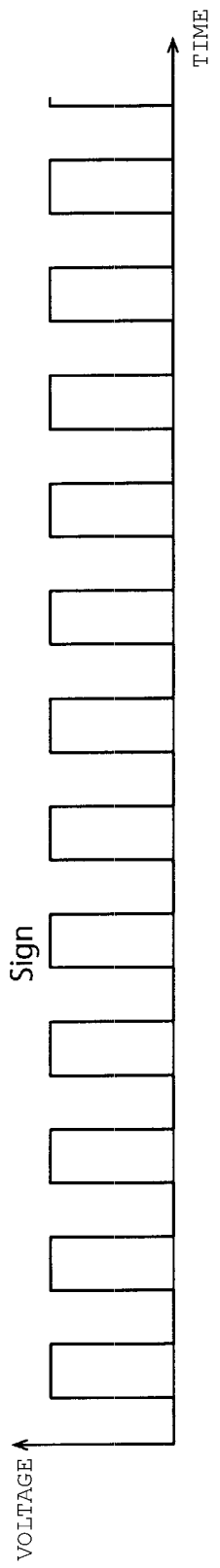

FIGS. 7A to 7C are other waveform diagrams for illustrating the operation of the wireless receiver of the first embodiment and show simulation results.

FIG. 7A shows the IF signal Vif that is input to the ADC 7, the first reference voltage Vref_u, the second reference voltage Vref_d, and the third reference voltage Vref_m. FIG. 7A is an enlarged view of FIG. 6A. FIG. 7B shows fluctuations of the first signal Mag in the case shown in FIG. 7A.

FIG. 7C shows fluctuations of the second signal Sign in the case shown in FIG. 7A.

The simulation results show that each of the duty ratio of the first signal Mag and the duty ratio of the second signal Sign converges to a specific value by appropriately adjusting the first reference voltage Vref_u and the second reference voltage Vref_d of the ADC 7.

It is noted that the difference between the first reference voltage Vref_u and the third reference voltage Vref_m, and the difference between the third reference voltage Vref_m and the second reference voltage Vref_d, are set at the same amount in this example, as shown in FIGS. 6A and 7A.

As described above, the wireless receiver of this first embodiment controls the first reference voltage Vref_u and the second reference voltage Vref_d of the ADC 7 on the basis of the first signal Mag output from the ADC 7. Thus, the function for adjusting the IF signal, which would otherwise performed by the PGA 17, can be provided by the function for controlling the reference voltage Vref, whereby the AGC circuit can be constituted without using a PGA 17. Accordingly, this first embodiment enables reduction in size of the AGC circuit and likewise a reduction in chip area of the wireless receiver, thereby decreasing the amount of current consumption of the wireless receiver.

Second Embodiment

Figure 8:
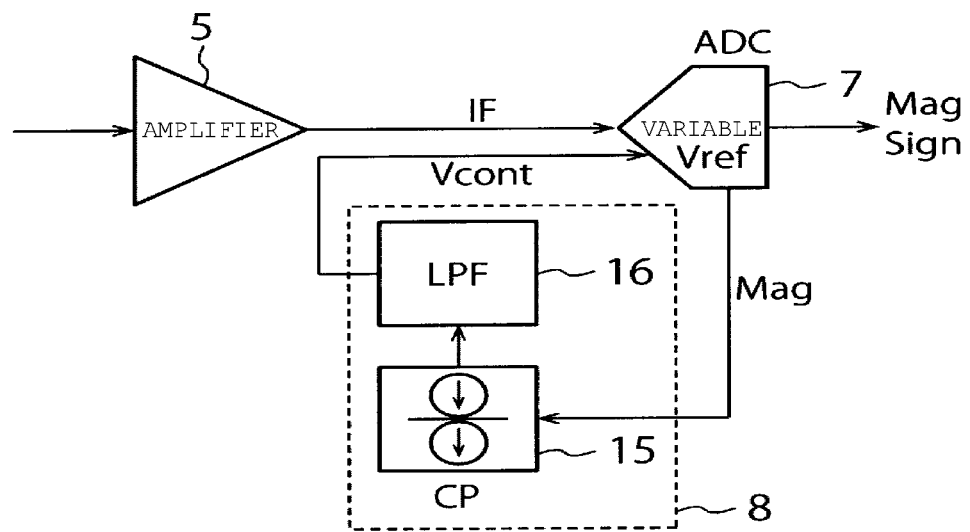
FIG. 8 is a circuit diagram for illustrating a structure of an AGC circuit according to a second embodiment.

FIG. 8 is a circuit diagram for illustrating a structure of an AGC circuit of a second embodiment.

The wireless receiver of this second embodiment has the structure of the wireless receiver of the first embodiment excluding the VGA 6. FIG. 8 shows an amplifier 5, an ADC 7, and a gain controlling unit 8, which are structural components of a part of the wireless receiver of this second embodiment. The gain controlling unit 8 has a CP 15 and an LPF 16. The AGC circuit of this second embodiment is constituted of the gain controlling unit 8 and does not include a VGA 6.

Thus, the ADC 7 of this second embodiment converts an IF signal from the amplifier 5 into a digital signal on the basis of the multiple reference voltages Vrefs. In the first embodiment, the VGA 6 adjusts the amplitude of the IF signal to be input to the ADC 7 to a value that is appropriate for the analog-to-digital conversion. However, in this second embodiment, the amplitude of the IF signal is not adjusted in such manner but rather is made to be an appropriate value by adjusting one or more of the reference voltages Vref.

The CP 15 controls the ADC 7 in the same manner as in the first embodiment. The CP 15 controls at least one of reference voltages Vrefs of the ADC 7 on the basis of the digital signal output from the ADC 7. Specifically, the CP 15 outputs a control signal for controlling at least one of the reference voltages Vrefs, and the control signal is supplied to the ADC 7 through the LPF 16. The digital signal contains a first signal Mag, which represents the amplitude of the value of the digital signal, and contains a second signal Sign, which represents a sign of the value of the digital signal. The CP 15 of this embodiment also operates by using the first signal Mag, as shown in FIG. 8. The structure of the ADC 7 is described in FIG. 4, and the structure of the CP 15 is described in FIG. 5. The reference symbol "Vcont" represents the control signal to be supplied to the ADC 7.

Here, the first embodiment and the second embodiment are compared with each other for purposes of explanation. The wireless receiver of the first embodiment can adjust the amplitude of the IF signal to be input to the ADC 7 by using the VGA 6, and the ADC 7 is thus relatively easy to design. On the other hand, the wireless receiver of this second embodiment does not have a VGA 6, so the size of the AGC circuit can be further reduced.

In the AGC circuit of the first embodiment, the IF signal is inside the AGC loop, and the reference voltages Vrefs of the ADC 7 are varied statically. On the other hand, in the AGC circuit of this second embodiment, the If signal is outside the AGC loop, and the reference voltages Vrefs of the ADC 7 are varied dynamically. Each of the first embodiment and the second embodiment enables incorporation of the AGC circuit while allowing the circuit size of the wireless receiver to be reduced.

As described above, the wireless receiver of this second embodiment controls the reference voltage Vref of the ADC 7 on the basis of the digital signal output from the ADC 7. Thus, the function for adjusting the IF signal, which would otherwise be performed by the PGA 17 or the VGA 6, can be can be replaced by the function for controlling the reference voltage Vref, whereby the AGC circuit can be constituted without using the PGA 17 and the VGA 6. Accordingly, this second embodiment enables further reduction in size of the AGC circuit as well as reduction in chip area of the wireless receiver, thereby decreasing the amount of current consumption of the wireless receiver.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A wireless receiver, comprising:
    an analog-to-digital converter configured to convert a first signal corresponding to a received signal into a digital signal on the basis of multiple reference voltages and output the digital signal; and
    a control circuit configured to control at least one of the multiple reference voltages on the basis of the digital signal that is output from the analog-to-digital converter, wherein
    the analog-to-digital converter outputs a first component signal that corresponds to an amplitude value of the digital signal and a second component signal that corresponds to a sign value of the digital signal, and
    the control circuit controls the at least one of the multiple reference voltages on the basis of the first component signal.

2. The wireless receiver according to claim 1, further comprising:
    a low-noise amplifier configured to receive the received signal, amplify the received signal, and output an amplified signal; and
    a variable gain amplifier configured to receive a second signal corresponding to the amplified signal from the low-noise amplifier, amplify the second signal, and output a resultant signal, as the first signal, to the analog-to-digital converter, wherein
    the control circuit is further configured to control a gain of the variable gain amplifier on the basis of the digital signal output from the analog-to-digital converter.

3. The wireless receiver according to claim 1, further comprising:
    a low-noise amplifier configured to receive the received signal, amplify the received signal, and output an amplified signal; and
    a fixed gain amplifier configured to receive a second signal corresponding to the amplified signal from the low-noise amplifier, amplify the second signal, and output the resultant signal as the first signal to the analog-to-digital converter,
    wherein the amplifier has a gain that is not controlled by the control circuit.

4. The wireless receiver according to claim 1, wherein the control circuit includes:
    a first current source and a second current source connected in series; and
    a first switch and a second switch connected in series between the first current source and the second current source, wherein
    the first switch operates in accordance with the first component signal,
    the second switch operates in accordance with an inverted first component signal, and
    the control circuit is configured to output a control signal for controlling the at least one of the multiple reference voltages from a node that is between the first switch and the second switch.

5. The wireless receiver according to claim 1, wherein the analog-to-digital converter includes:
    a control block configured to generate the multiple reference voltages and vary the at least one of the multiple reference voltages;
    a plurality of comparators that compare the first signal to each of the multiple reference voltages; and
    an output part configured to generate the digital signal on the basis of signals from the plurality of comparators.

6. A wireless receiver, comprising:
    a low-noise amplifier receiving a first signal and amplifying the first signal to output a second signal;
    a filter receiving a third signal corresponding to the second signal, filtering the third signal, and outputting a fourth signal corresponding to the third signal;
    a fixed gain amplifier receiving the fourth signal, amplifying the fourth signal, and outputting a fifth signal corresponding to the fourth signal;
    an analog-to-digital converter receiving a sixth signal corresponding to the fifth signal and outputting a digital signal corresponding to the sixth signal, the conversion to the digital signal by the analog-to-digital converter being performed using a plurality of reference voltages; and
    a control circuit configured to control a reference voltage in the plurality of reference voltages according to the digital signal, wherein
    the analog-to-digital converter outputs a first component signal that corresponds to an amplitude value of the digital signal and a second component signal that corresponds to a sign value of the digital signal, and
    the control circuit controls the reference voltage on the basis of the first component signal.

7. The wireless receiver according to claim 6, further comprising:
    a variable gain amplifier configured to receive the fifth signal from the fixed gain amplifier, amplify the fifth signal, and output the sixth signal to the analog-to-digital converter.

8. The wireless receiver according to claim 7, wherein the control circuit is further configured to supply a control signal to the variable gain amplifier to adjust a gain of the variable gain amplifier according to the digital signal.

9. The wireless receiver according to claim 8, wherein the control circuit includes a charge pump and a low pass filter.

10. The wireless receiver according to claim 6, wherein the control circuit includes a charge pump and a low pass filter.

11. The wireless receiver according to claim 6, wherein the control circuit includes:
a first current source and a second current source connected in series; and
a first switch and a second switch connected in series between the first current source and the second current source, wherein
the first switch operates in accordance with the first component signal,
the second switch operates in accordance with an inverted first component signal, and
the control circuit is configured to output a control signal to the analog-to-digital converter from a node that is between the first switch and the second switch, the reference voltage being varied according to the control signal.

12. The wireless receiver according to claim 6, wherein the analog-to-digital converter includes:
a control block configured to generate the plurality reference voltages and vary the reference voltage in the plurality of reference voltage according to the digital signal;
a plurality of comparators that compare the sixth signal to the plurality of reference voltages; and
an output part configured to generate the digital signal on the basis of signals from the plurality of comparators.

13. A wireless receiver, comprising:
a low-noise amplifier receiving a first signal from an antenna;
a frequency converter receiving a second signal from the low-noise amplifier, the second signal corresponding to an amplified first signal;
a receiving filter receiving a third signal from the frequency converter, the third signal corresponding to a frequency-converted second signal;
a fixed gain amplifier receiving a fourth signal from the receiving filter, the fourth signal corresponding to a frequency-filtered third signal;
a variable-gain amplifier receiving a fifth signal from the fixed gain amplifier, the fifth signal corresponding to an amplified fourth signal;
an analog-to-digital converter receiving a sixth signal from the variable-gain amplifier, the sixth signal corresponding to an amplified fifth signal, and outputting a digital signal; and
a control circuit configured to:
control a gain amount of the low-noise amplifier and a gain amount of the variable-gain amplifier according to the digital signal, and
supply a control signal to the analog-to-digital converter according to the digital signal, wherein
the analog-to-digital converter generates the digital signal according to a plurality of reference voltages and the control signal is used to change a level of at least one reference voltage in the plurality of reference voltages, and
the control circuit comprises a charge pump and a low pass filter.

14. The wireless receiver according to claim 13, wherein
the analog-to-digital converter outputs the digital signal as a first component signal that corresponds to an amplitude value of the digital signal and a second component signal that corresponds to a sign value of the digital signal, and
the control circuit adjusts the control signal on the basis of the first component signal.

15. The wireless receiver according to claim 14, wherein the control circuit includes:
a first current source and a second current source connected in series; and
a first switch and a second switch connected in series between the first current source and the second current source, wherein
the first switch operates in accordance with the first component signal,
the second switch operates in accordance with an inverted first component signal, and
the control circuit is configured to output the control signal from a node between the first switch and the second switch.

16. The wireless receiver according to claim 13, wherein the analog-to-digital converter includes:
a control block configured to generate the plurality of reference voltages and vary the at least one of reference voltage;
a plurality of comparators that compare the sixth signal to each of the plurality of reference voltages; and
an output part configured to generate the digital signal on the basis of signals from the plurality of comparators.

17. The wireless receiver according to claim 13, further comprising:
a digital filter receiving the digital signal from the analog-to-digital converter; and
a demodulator receiving a filtered digital signal from the digital filter and outputting a demodulated signal corresponding to the first signal.

* * * * *